US012505994B2

(12) United States Patent
Kim et al.

(10) Patent No.: US 12,505,994 B2

(45) Date of Patent: Dec. 23, 2025

(54) PLASMA MONITORING APPARATUS AND PLASMA PROCESSING APPARATUS INCLUDING THE SAME

(71) Applicant: Samsung Display Co., LTD., Yongin-si (KR)

(72) Inventors: Inkyo Kim, Seongnam-si (KR); Sukwon Jung, Sejong-si (KR); Eunsoo Lee, Hwaseong-si (KR); Hyunwoo Joo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 668 days.

(21) Appl. No.: 17/859,623

(22) Filed: Jul. 7, 2022

(65) Prior Publication Data

US 2023/0130913 A1 Apr. 27, 2023

(30) Foreign Application Priority Data

Oct. 27, 2021 (KR) ........................ 10-2021-0144264

(51) Int. Cl.
*H01J 37/32* (2006.01)

(52) U.S. Cl.
CPC .............................. *H01J 37/32972* (2013.01)

(58) Field of Classification Search
CPC ................................................ H01J 37/32972
See application file for complete search history.

(56) References Cited

U.S. PATENT DOCUMENTS 10,541,184 B2 1/2020 Jung et al.
10,748,749 B1 8/2020 Mun et al.
2004/0069408 A1 * 4/2004 Cheng .............. H01J 37/32458
156/345.25

FOREIGN PATENT DOCUMENTS

JP 07161697 A * 6/1995
JP 2004031398 A * 1/2004
KR 10-2012-0026872 3/2012
KR 10-2014-0040597 4/2014
KR 10-2016-0058490 5/2016
KR 20200110955 A 9/2020
KR 20200118938 A 10/2020

OTHER PUBLICATIONS

Korean Office Action, Application No. 10-2021-0144264 filed Oct. 27, 2021, mailed May 30, 2025, 11 pages. with English Translation.

* cited by examiner

*Primary Examiner* — Yuechuan Yu
(74) *Attorney, Agent, or Firm* — CANTOR COLBURN LLP

(57) ABSTRACT

A plasma monitoring apparatus includes a flow control portion including a first port through which an emission light emitted from a plasma is introduced or discharged, and a second port through which the emission light emitted from the plasma is introduced or discharged and has a shape different from a shape of the first port, a transparent glass window extended to the flow control portion and passing an emission light, and a spectroscopic apparatus optically connected to the transparent glass window through an optical fiber and detecting an intensity of the emission light.

19 Claims, 7 Drawing Sheets

PLASMA MONITORING APPARATUS AND PLASMA PROCESSING APPARATUS INCLUDING THE SAME

CROSS-REFERENCE TO RELATED APPLICATION

This application claims priority to and benefits of Korean Patent Application No. 10-2021-0144264 under 35 U.S.C. § 119, filed on Oct. 27, 2021 under the Korean Intellectual Property Office, the disclosure of which is incorporated by reference herein in its entirety.

BACKGROUND

1. Technical Field

Embodiments provide generally to a plasma monitoring apparatus and a plasma processing apparatus including the same.

2. Description of the Related Art

In general, plasma refers to an ionized gas state composed of ions, electrons, radicals, and the like. Plasma may be generated by very high temperature, strong electric fields, or radio frequency electromagnetic fields (RF).

A plasma processing apparatus may be an apparatus for depositing a reactant material in a plasma state on a substrate, or cleaning, ashing, or etching the substrate using a plasma state reaction material. A plasma processing apparatus may include a lower electrode installed in a process chamber to mount a substrate, and an upper electrode installed in an upper portion of the process chamber to face the lower electrode.

Recently, as the difficulty of a process using plasma increases, the importance of a technique for monitoring the state of the plasma is increasing in order to precisely control the plasma processing process. Accordingly, research on a technology for monitoring the state of plasma used in a plasma processing process is continuing.

SUMMARY

Embodiment provides a plasma monitoring apparatus for observing plasma distribution.

Embodiment provides a plasma processing apparatus including the plasma monitoring apparatus.

A plasma monitoring apparatus according to embodiments of the disclosure may include a flow control portion including a first port through which an emission light emitted from a plasma is introduced or discharged, and a second port through which the emission light emitted from the plasma is introduced or discharged and having a shape different from a shape of the first port, a transparent glass window extended to the flow control portion and passing the emission light, and a spectroscopic apparatus optically connected to the transparent glass window through an optical fiber and detecting an intensity of the emission light.

In an embodiment, the first port may include a first tube structure having a first inner diameter and a second tube structure extended to the first tube structure and having a second inner diameter different from the first inner diameter. The second port may include a third tube structure having a third inner diameter and a fourth tube structure extended to the third tube structure and having a fourth inner diameter different from the third inner diameter.

In an embodiment, the second inner diameter may be greater than the first inner diameter and the fourth inner diameter may be greater than the third inner diameter.

In an embodiment, the first port may be an inlet port through which the emission light is introduced, and the second port may be an outlet port through which the emission light is discharged.

In an embodiment, a length of the first tube structure in a traveling direction of the emission light may be shorter than a length of the third tube structure in the traveling direction.

In an embodiment, the first inner diameter and the third inner diameter may be same and the second inner diameter and the fourth inner diameter may be same.

In an embodiment, the second inner diameter may be greater than the first inner diameter and the third inner diameter may be greater than the fourth inner diameter.

In an embodiment, the second port may be an inlet port through which the emission light is introduced, and the first port may be an outlet port through which the emission light is discharged.

In an embodiment, the first inner diameter may be greater than the second inner diameter and the fourth inner diameter may be greater than the third inner diameter.

In an embodiment, the second inner diameter may be greater than the first inner diameter, the fourth inner diameter may be greater than the third inner diameter, and the third inner diameter may be greater than the first inner diameter.

In an embodiment, the first port may include a first tube structure having a first inner diameter and a second tube structure extended to the first tube structure and having the first diameter. The second port may include a third tube structure having a third inner diameter and a fourth tube structure extended to the third tube structure and having a fourth inner diameter different from the third inner diameter.

In an embodiment, the fourth inner diameter may be greater than the third inner diameter.

In an embodiment, the flow control portion may further include a passage portion including a space through which the emission light travels and a connection portion connecting the first port and the second port to the passage portion.

In an embodiment, the spectroscopy apparatus may include an optical emission spectroscopy (OES).

A plasma processing apparatus according to embodiments of the disclosure may include a process chuck for supporting a process object in a process chamber, a shower head positioned to face the process chuck, and a plasma monitoring apparatus extended to the process chamber and monitoring a plasma processing process in the process chamber. The plasma monitoring apparatus may include a flow control portion including a first port through which an emission light emitted from a plasma is introduced or discharged, and a second port through which the emission light emitted from the plasma is introduced or discharged and having a shape different from a shape of the first port, a transparent glass window extended to the flow control portion and passing the emission light, and a spectroscopic apparatus optically connected to the transparent glass window through an optical fiber and detecting an intensity of the emission light.

In an embodiment, the first port may include a first tube structure having a first inner diameter and a second tube structure extended to the first tube structure and having a second inner diameter different from the first inner diameter. The second port may include a third tube structure having a third inner diameter and a fourth tube structure extended to the third tube structure and having a fourth inner diameter different from the third inner diameter.

In an embodiment, the second inner diameter may be greater than the first inner diameter and the fourth inner diameter may be greater than the third inner diameter.

In an embodiment, the first port may be an inlet port through which the emission light is introduced, and the second port may be an outlet port through which the emission light is emitted.

In an embodiment, a length of the first tube structure in a traveling direction of the emission light may be shorter than a length of the third tube structure in the traveling direction.

In an embodiment, the flow control portion may further include a passage portion including a space through which the emission light travels and a connection portion connecting the first port and the second port to the passage portion.

In the plasma monitoring apparatus according to an embodiment of the disclosure, a flow control portion may include a first port through which an emission light emitted from plasma is introduced or discharged, and a second port through which the emission light is introduced or discharged and having a shape different from a shape of the first port. Accordingly, an amount of change in pressure inside the flow control portion may be reduced. Accordingly, an accumulation of false data (e.g., noise) of a measurement value may be suppressed.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
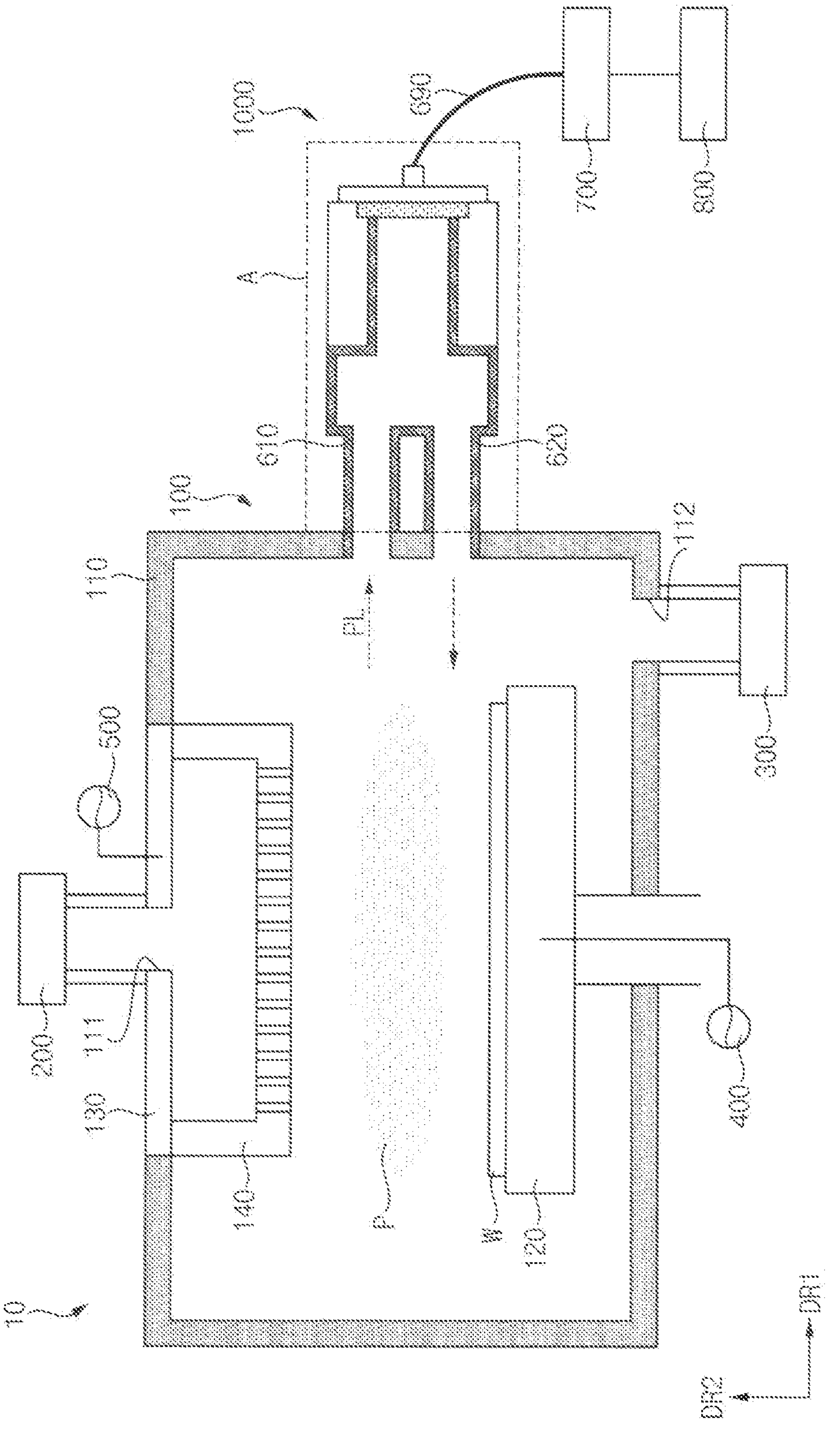
FIG. 1 is a schematic cross-sectional view illustrating a plasma processing apparatus according to an embodiment.

Hereinafter, embodiments of the disclosure will be explained in detail with reference to the accompanying drawings. The same reference numerals are used for the same components in the drawings, and redundant descriptions of the same components will be omitted.

Figure 2:
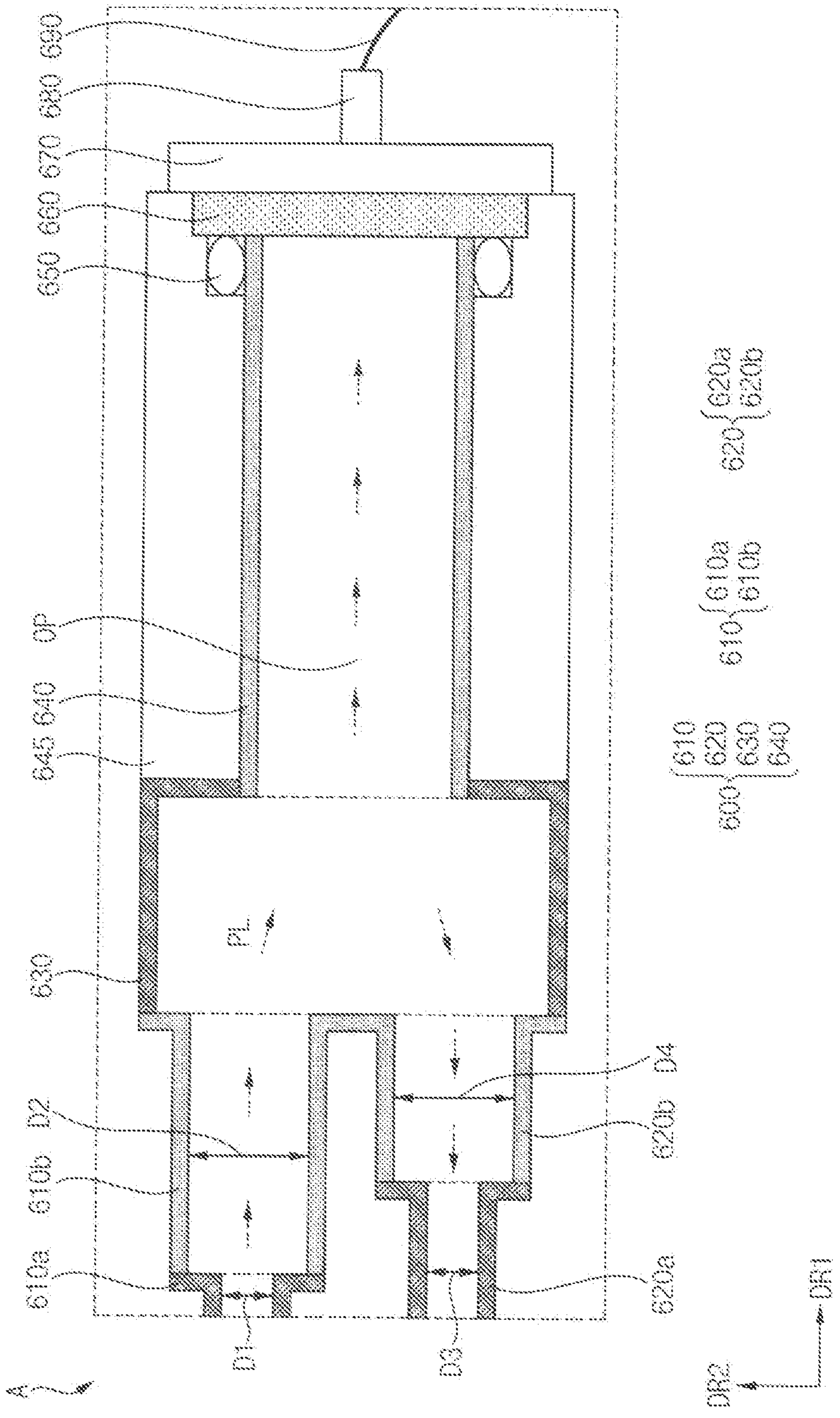
FIG. 2 is a schematic cross-sectional view illustrating an enlarged portion “A” of FIG. 1.

FIG. 1 is a schematic cross-sectional view illustrating a plasma processing apparatus according to an embodiment. FIG. 2 is a schematic cross-sectional view illustrating an enlarged portion “A” of FIG. 1. For example, FIG. 2 is a schematic cross-sectional view an enlarged portion of the plasma monitoring apparatus 1000.

Referring to FIGS. 1 and 2, the plasma processing apparatus 10 according to an embodiment may include a process chamber 100, a process chuck 120, an upper electrode 130, a shower head 140, a gas supply portion 200, a vacuum pump 300, a first power supply portion 400, a second power supply portion 500, and a plasma monitoring apparatus 1000. However, the plasma processing apparatus 10 is not limited thereto, and various types of plasma processing apparatuses may be applied.

The process chamber 100 may provide a space for processing a process object W using plasma P. For example, the process chamber 100 may include a material having excellent wear resistance and corrosion resistance. In the plasma processing process, the process chamber 100 may maintain an internal space in a closed state or a vacuum state.

For example, the process object W may be a semiconductor substrate such as a silicon wafer for manufacturing a semiconductor device, or a glass substrate for manufacturing a flat panel display device. Examples of the process of processing the process object W using the plasma P may include an etching process, a deposition process, an ashing process, and a cleaning process. However, the disclosure is not limited thereto.

A side wall 110 of the process chamber 100 may surround a space in which the process using the plasma P is performed. The processing of the process object W by the plasma P may be performed inside of the process chamber 100. The process chamber 100 may include an inlet 111 and an exhaust port 112.

The inlet 111 may be extended to the gas supply portion 200. The gas supply portion 200 may supply a reaction gas to inside of the process chamber 100 through the inlet 111. For example, the inlet 111 may be positioned on an upper surface of the process chamber 100.

The exhaust port 112 may be extended to the vacuum pump 300. The reaction gas and process by-products remaining inside of the process chamber 100 may be discharged to outside of the process chamber 100 through the exhaust port 112. For example, the exhaust port 112 may be positioned on a lower surface of the process chamber 100.

The process chuck 120 may support the process object W while the plasma processing process is performed. The process chuck 120 may be positioned inside of the process chamber 100. The process chuck 120 may be positioned to face the inlet 111. For example, the process chuck 120 may be positioned on a lower portion of the process chamber 100.

The process chuck 120 may be electrically connected to the first power supply portion 400. For example, the process chuck 120 may include an electrostatic chuck (ESC). The upper electrode 130 may be electrically connected to the second power supply portion 500. For example, the plasma P may be generated inside of the process chamber 100 by a voltage difference between the process chuck 120 and the upper electrode 130.

The upper electrode 130 may be positioned to face the process chuck 120. For example, the upper electrode 130 may be positioned on the upper surface of the process chamber 100. The upper electrode 130 may be positioned adjacent to the inlet 111 of the process chamber 100. For example, the inlet 111 of the process chamber 100 may pass through the upper electrode 130.

The shower head 140 may spray the reaction gas supplied from the gas supply portion 200 into the side wall 110. The shower head 140 may be positioned to face the process chuck 120. For example, the shower head 140 may be positioned under the inlet 111 of the process chamber 100. The shower head 140 may be positioned under the upper electrode 130. For example, the shower head 140 may be electrically connected to the upper electrode 130. Accordingly, the plasma P may be generated in a space between the shower head 140 and the process chuck 120.

The plasma monitoring apparatus 1000 may be extended to the process chamber 100. The plasma monitoring apparatus 1000 may be an apparatus for monitoring a plasma processing process for processing the process object W and the like. The plasma monitoring apparatus 1000 may measure the amount of light and the irradiation time of an emission light PL emitted from the plasma P in real time to determine the progress of the plasma processing process.

Referring to FIGS. 1 and 2, the plasma monitoring apparatus 1000 according to an embodiment may include a flow control portion 600, an insulator 645, a sealing member 650, a transparent glass window 660, a block member 670, a fiber optic connector 680, an optical fiber 690, a spectroscopic apparatus 700, and a control apparatus 800.

The flow control portion 600 may include a first port 610 through which the emission light PL emitted from the plasma P is introduced or discharged, and a second port 620 through which the emission light PL emitted from the plasma P is introduced or discharged and having a shape different from a shape of the first port 610. For example, the first port 610 may be an inlet port through which the emission light PL is introduced. The second port 620 may be an outlet port through which the emission light PL is discharged. However, the configuration of the disclosure is not limited thereto.

The first port 610 may include a first tube structure **610*a* having a first inner diameter D1, and a second tube structure 610*b* extended to the first tube structure 610*a* and having a second inner diameter D2 different from the first inner diameter D1. The second port 620 may also include a third tube structure 620*a* having a third inner diameter D3, and a fourth tube structure 620*b* extended to the third tube structure 620*a* and having a fourth inner diameter D4 different from the third inner diameter D3**.

Here, each of the first, second, third, and fourth inner diameters D1, D2, D3, and D4 may mean a length in a longitudinal direction (e.g., a second direction DR2) of each of the first, second, third, and fourth tube structures **610*a*, 610*b*, 620*a*, and 620*b***.

The process chamber 100 may further include a first through portion and a second through portion adjacent to the first through portion. Each of the first tube structure **610*a* and the third structure 620*a*** may be extended to each of the first through portion and the second through portion.

In an embodiment, the first inner diameter D1 may be different from the second inner diameter D2 and the third inner diameter D3 may be different from the fourth inner diameter D4. For example, the first inner diameter D1 may be same as the third inner diameter D3 and the second inner diameter D2 may be same as the fourth inner diameter D4. However, the configuration of the disclosure is not limited thereto, and the first inner diameter D1 may be different from the third inner diameter D3 and the second inner diameter D2 may be different from the fourth inner diameter D4.

A length of the first tube structure **610*a* in a traveling direction (e.g., a first direction DR1) of the emission light PL may be smaller than a length of the third tube structure 620*a* in the traveling direction of the emission light PL. A length of the second tube structure 610*b* in the traveling direction of the emission light PL may be greater than a length of the fourth tube structure 620*b*** in the traveling direction of the emission light PL. However, the configuration of the disclosure is not limited thereto.

The plasma monitoring apparatus 1000 may have a problem in that the stability of the measurement value is deteriorated according to the change of the environment inside the process chamber 100. Accordingly, a false data (e.g., noise) of a measured value may be accumulated, and a loss of process productivity may occur due to an accumulation of the false data. In case that an internal pressure of the flow control portion 600 is unstable, the false data may be accumulated.

Figure 3:
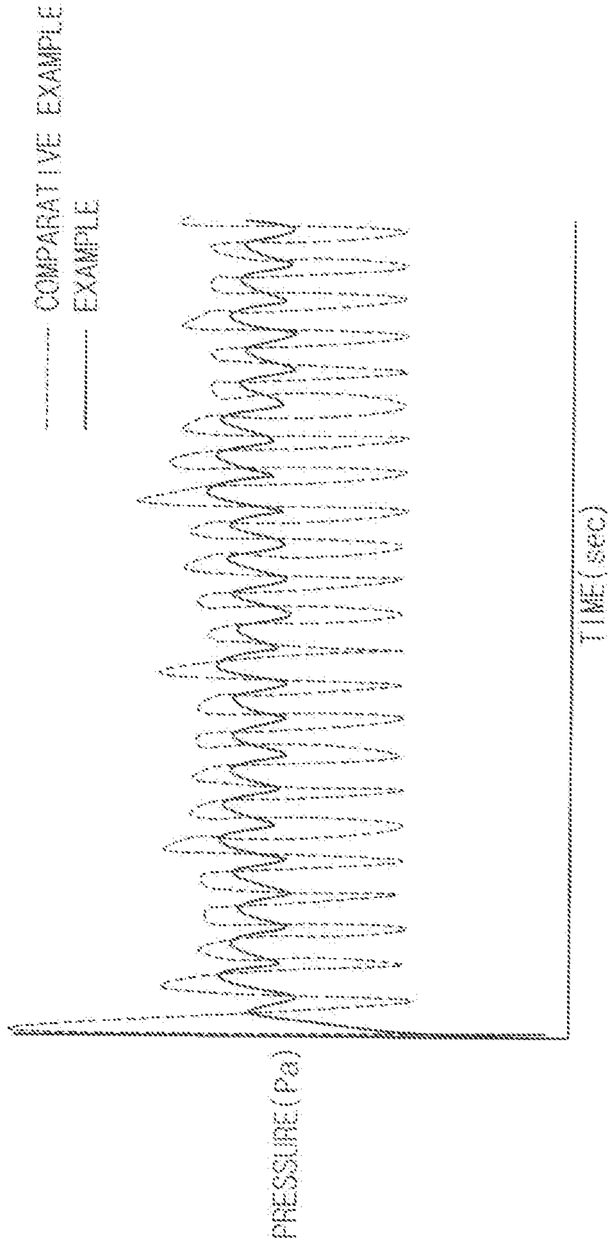
FIG. 3 is a schematic diagram illustrating a change in pressure inside of a flow control portion over time.

FIG. 3 is a schematic diagram illustrating a change in pressure inside of a flow control portion over time.

Referring to FIG. 3, the comparative example may be a case in which the flow control portion 600 includes one port through which the emission light PL is introduced and discharged. The example may be case in which the flow control portion 600 includes the first port 610 and the second port 620 through which the emission light PL is introduced and discharged, respectively. In the comparative example, it may be confirmed that a change of the internal pressure of the flow control portion 600 over time is large. In the example, it may be confirmed that a change of the internal pressure of the flow control portion 600 over time is small. For example, in the case of the comparative example, the internal pressure of the flow control portion 600 may be unstable. In other words, in case that the flow control portion 600 includes the first port 610 and the second port 620 through which the emission light PL is introduced or discharge, respectively, the accumulation of the false data may be diminished.

Referring back to FIGS. 1 and 2, the flow control portion 600 may also include a connection portion 630 and a passage portion 640. The connection portion 630 may connect the first port 610, the second port 620, and the passage portion 640. The passage portion 640 may provide a space through which the emission light PL travels. For example, the emission light PL may travel in the first direction DR1 or a direction opposite to the first direction DR1 through an opening OP formed in the passage portion 640.

The transparent glass window 660 may be extended to the flow control portion 600. Specifically, the transparent glass window 660 may be extended to the passage portion 640 of the flow control portion 600. The transparent glass window 660 may be sealed to the insulator 645. The transparent glass window 660 may transmit the emission light PL.

The transparent glass window 660 may include a material having high transmittance. For example, the transparent glass window 660 may include quartz or the like. However, the material that may be included in the transparent glass window 660 is not limited thereto, and the transparent glass window 660 may include various high transmittance materials.

The sealing member 650 may be positioned on a side of the passage portion 640 to seal the transparent glass window 660 to the insulator 645. The insulator 645 may have a structure surrounding the passage portion 640. For example, the sealing member 650 may be an O-ring.

The block member 670 may connect the transparent glass window 660 and the fiber optic connector 680 to each other. For example, the block member 670 may be positioned between the transparent glass window 660 and the fiber optic connector 680. The block member 670 may be coupled to the insulator 645. For example, the block member 670 may be coupled to the insulator 645 by a connecting member. The connecting member may be a screw or the like. For example, the connecting member may be a plastic or ceramic screw. However, the material of the connecting member is not limited thereto.

The fiber optic connector 680 may connect the block member 670 and the optical fiber 690 to each other. The optical fiber 690 may be positioned such that the emission light PL emitted from the plasma P passes into the optical fiber 690 through the flow control portion 600 and the transparent glass window 660 to generate an optical signal. The optical fiber 690 may transmit the emission light PL to the spectroscopic apparatus 700.

The optical fiber 690 may be a core optical fiber having a size of about 400 μm. However, the configuration of the disclosure is not limited thereto, and in order to control the transmittance of the emission light PL and the signal strength in the optical fiber 690, the optical fiber 690 may be a core optical fiber having a different size. For example, in order to limit the optical signal reaching the spectroscopic apparatus 700, the plasma P generating a low level of the emission light PL may be monitored using a core optical fiber having a relatively wide size (e.g., about 400 μm). On the other hand, the plasma P generating a high level of the emission light PL may be monitored using a core optical fiber having a relatively narrow size (e.g., about 110 μm, about 100 μm, about 62.5 μm, about 50 μm, about 9 μm, or the like).

The spectroscopic apparatus 700 may be optically connected to the transparent glass window 660. Specifically, the spectroscopic apparatus 700 may be optically connected to the transparent glass window 660 through the block member 670, the fiber optic connector 680, and the optical fiber 690. The spectroscopic apparatus 700 may detect the radiation intensity of the emission light PL. In an embodiment, the spectroscopic apparatus 700 may include an optic emission spectroscopy (OES).

The spectroscopic apparatus 700 may analyze the optical signal received from the optical fiber 690 to identify an emission peak in the optical signal, including identifying a specific emission peak corresponding to an energy transition of a specific element. For example, information specifying spectrum and/or emission peak therein may be observed and/or manipulated in the spectroscopic apparatus 700.

Emission peak information may be transmitted to the control apparatus 800 for analysis, manipulation and/or storage. For example, the control apparatus 800 may include a computer. The control apparatus 800 may be disposed around the plasma processing apparatus 10 or may be positioned in a remote location and may be connected to the spectroscopic apparatus 700 through an intranet or internet connection.

In the plasma monitoring apparatus 1000 according to an embodiment of the disclosure, the flow control portion 600 may include a first port 610 through which the emission light PL emitted from the plasma P is introduced or discharged, and a second port 620 through which the emission light PL emitted from the plasma P is introduced or discharged and having a shape different from a shape of the first port 610. Accordingly, the changes in an internal pressure of the flow control portion 600 may be reduced. The accumulation of the false date may be diminished.

Figure 4:
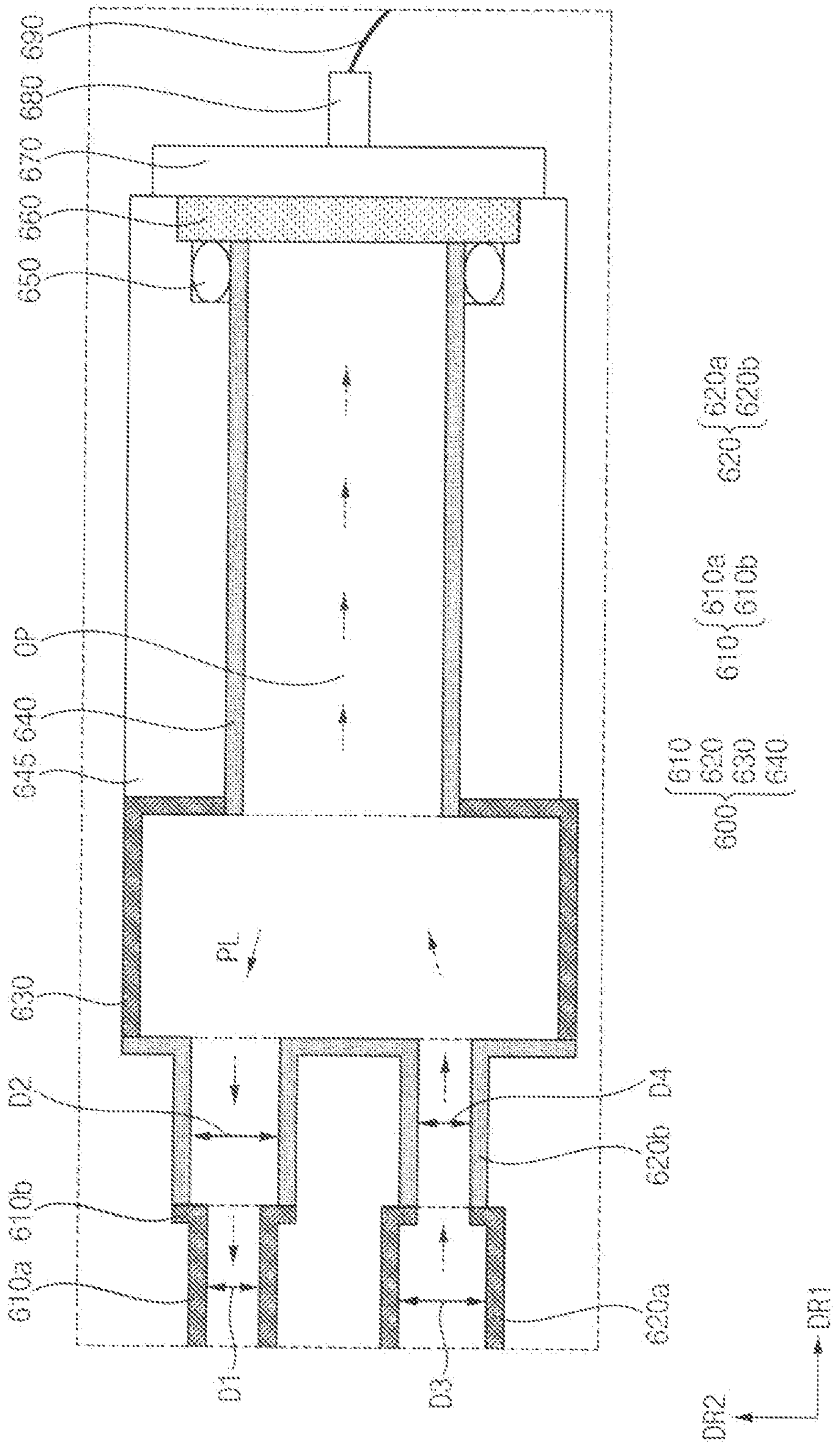
FIG. 4 is a schematic cross-sectional view illustrating a plasma monitoring apparatus according to an embodiment.

FIG. 4 is a schematic cross-sectional view illustrating a plasma monitoring apparatus according to an embodiment.

Referring to FIGS. 1 and 4, the plasma monitoring apparatus 1000 according to an embodiment may include a flow control portion 600, an insulator 645, a sealing member 650, a transparent glass window 660, a block member 670, a fiber optic connector 680, an optical fiber 690, a spectroscopic apparatus 700, and a control apparatus 800. The plasma monitoring apparatus 1000 described with reference to FIG. 4 may be substantially the same or similar to the plasma monitoring apparatus 1000 described with reference to FIG. 2 except for a shape of each of the first port 610 and the second port 620. Hereinafter, same descriptions will be omitted.

As described above, the first port 610 may include a first tube structure 610*a* and a second tube structure 610*b*. The second port 620 may include a third tube structure 620*a* and a fourth tube structure 620*b*.

The first inner diameter D1 of the first tube structure 610*a* may be different from the second inner diameter D2 of the second tube structure 610*b*. The third inner diameter D3 of the third tube structure 620*a* may be different from the fourth inner diameter D4 of the fourth tube structure 620*b*. For example, the second inner diameter D2 may be same as the third inner diameter D3 and the first inner diameter D1 may be same as the fourth inner diameter D4. However, the configuration of the disclosure is not limited thereto, and the second inner diameter D2 may be different from the third inner diameter D3 and the first inner diameter D1 may be different from the fourth inner diameter D4.

In an embodiment, the second inner diameter D2 may be greater than the first inner diameter D1 and the third inner diameter D3 may be greater than the fourth inner diameter D4. The first port 610 may be an outlet port and the second port 620 may be an inlet port. For example, the emission light PL may be introduced into the plasma monitoring apparatus 1000 through the second port 620 and may be discharged through the first port 610.

Figure 5:
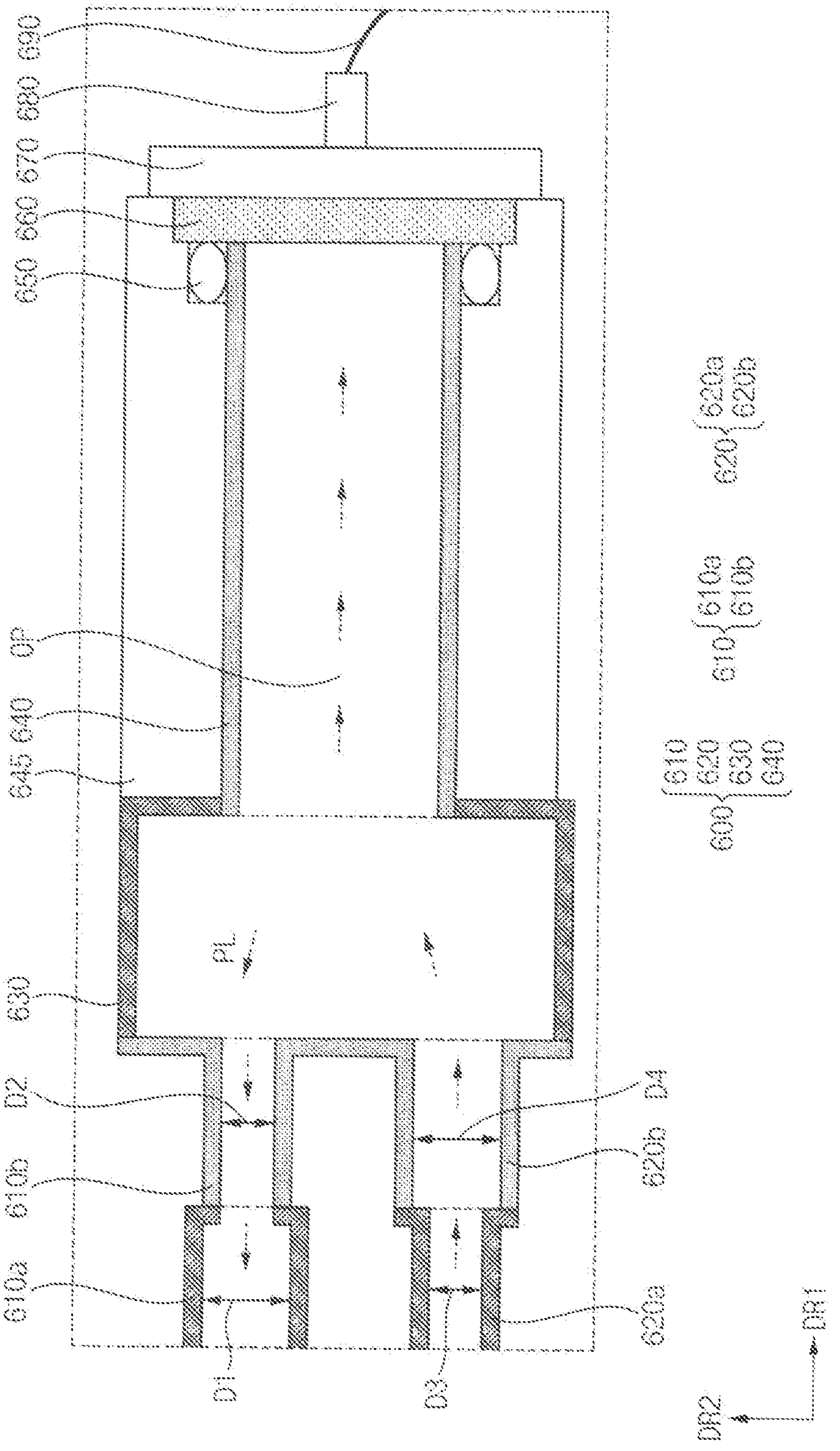
FIG. 5 is a schematic cross-sectional view illustrating a plasma monitoring apparatus according to an embodiment.

FIG. 5 is a schematic cross-sectional view illustrating a plasma monitoring apparatus according to an embodiment.

Referring to FIGS. 1 and 5, the plasma monitoring apparatus 1000 according to an embodiment may include a flow control portion 600, an insulator 645, a sealing member 650, a transparent glass window 660, a block member 670, a fiber optic connector 680, an optical fiber 690, a spectroscopic apparatus 700, and a control apparatus 800. The plasma monitoring apparatus 1000 described with reference to FIG. 5 may be substantially the same or similar to the plasma monitoring apparatus 1000 described with reference to FIG. 2 except for a shape of each of the first port 610 and the second port 620. Hereinafter, same descriptions will be omitted.

As described above, the first port 610 may include the first tube structure 610*a* and the second tube structure 610*b*. The second port 620 may include the third tube structure 620*a* and the fourth tube structure 620*b*.

The first inner diameter D1 of the first tube structure 610*a* may be different from the second inner diameter D2 of the second tube structure 610*b*. The third inner diameter D3 of the third tube structure 620*a* may be different from the fourth inner diameter D4 of the fourth tube structure 620*b*. For example, the second inner diameter D2 may be same as the third inner diameter D3 and the first inner diameter D1 may be same as the fourth inner diameter D4. However, the configuration of the disclosure is not limited thereto, and the second inner diameter D2 may be different from the third inner diameter D3 and the first inner diameter D1 may be different from the fourth inner diameter D4.

In an embodiment, the first inner diameter D1 may be greater than the second inner diameter D2 and the fourth inner diameter D4 may be greater than the third inner diameter D3. The first port 610 may be an outlet port and the second port 620 may be an inlet port. For example, the emission light PL may be introduced into the plasma monitoring apparatus 1000 through the second port 620 and may be discharged through the first port 610.

Figure 6:
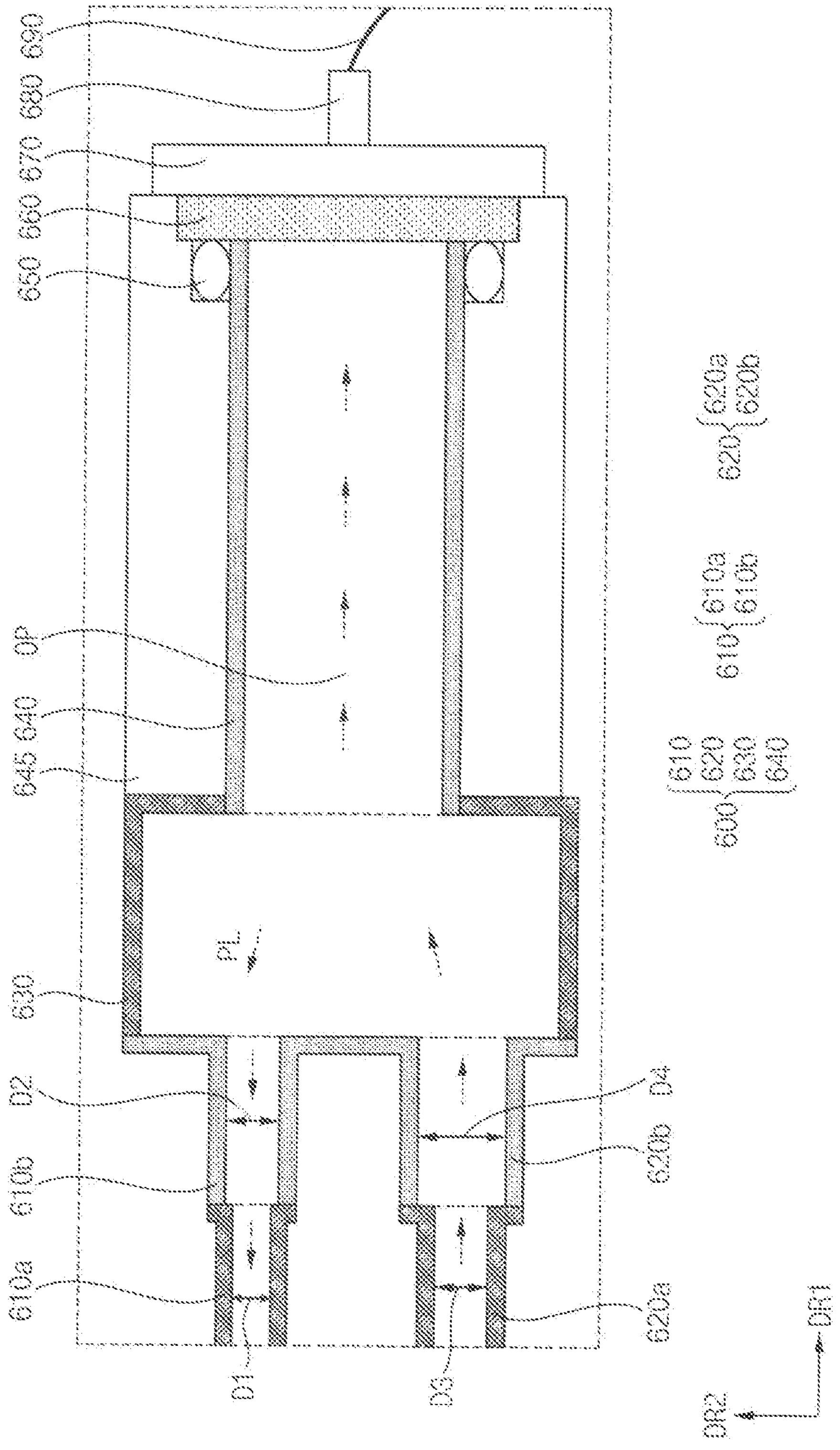
FIG. 6 is a schematic cross-sectional view illustrating a plasma monitoring apparatus according to an embodiment.

FIG. 6 is a schematic cross-sectional view illustrating a plasma monitoring apparatus according to an embodiment.

Referring to FIGS. 1 and 6, the plasma monitoring apparatus 1000 according to an embodiment may include a flow control portion 600, an insulator 645, a sealing member 650, a transparent glass window 660, a block member 670, a fiber optic connector 680, an optical fiber 690, a spectroscopic apparatus 700, and a control apparatus 800. The plasma monitoring apparatus 1000 described with reference to FIG. 6 may be substantially the same or similar to the plasma monitoring apparatus 1000 described with reference to FIG. 2 except for a shape of each of the first port 610 and the second port 620. Hereinafter, same descriptions will be omitted.

As described above, the first port 610 may include a first tube structure 610*a* and a second tube structure 610*b*. The second port 620 may include a third tube structure 620*a* and a fourth tube structure 620*b*.

The first inner diameter D1 of the first tube structure 610*a* may be different from the second inner diameter D2 of the second tube structure 610*b*. The third inner diameter D3 of the third tube structure 620*a* may be different from the fourth inner diameter D4 of the fourth tube structure 620*b*. For example, the second inner diameter D2 may be same as the third inner diameter D3. However, the configuration of the disclosure is not limited thereto, and the second inner diameter D2 may be different from the third inner diameter D3.

In an embodiment, the second inner diameter D2 may be greater than the first inner diameter D1 and the fourth inner diameter D4 may be greater than the third inner diameter D3. The first port 610 may be an outlet port and the second port 620 may be an inlet port. For example, the emission light PL may be introduced into the plasma monitoring apparatus 1000 through the second port 620 and may be discharged through the first port 610.

Figure 7:
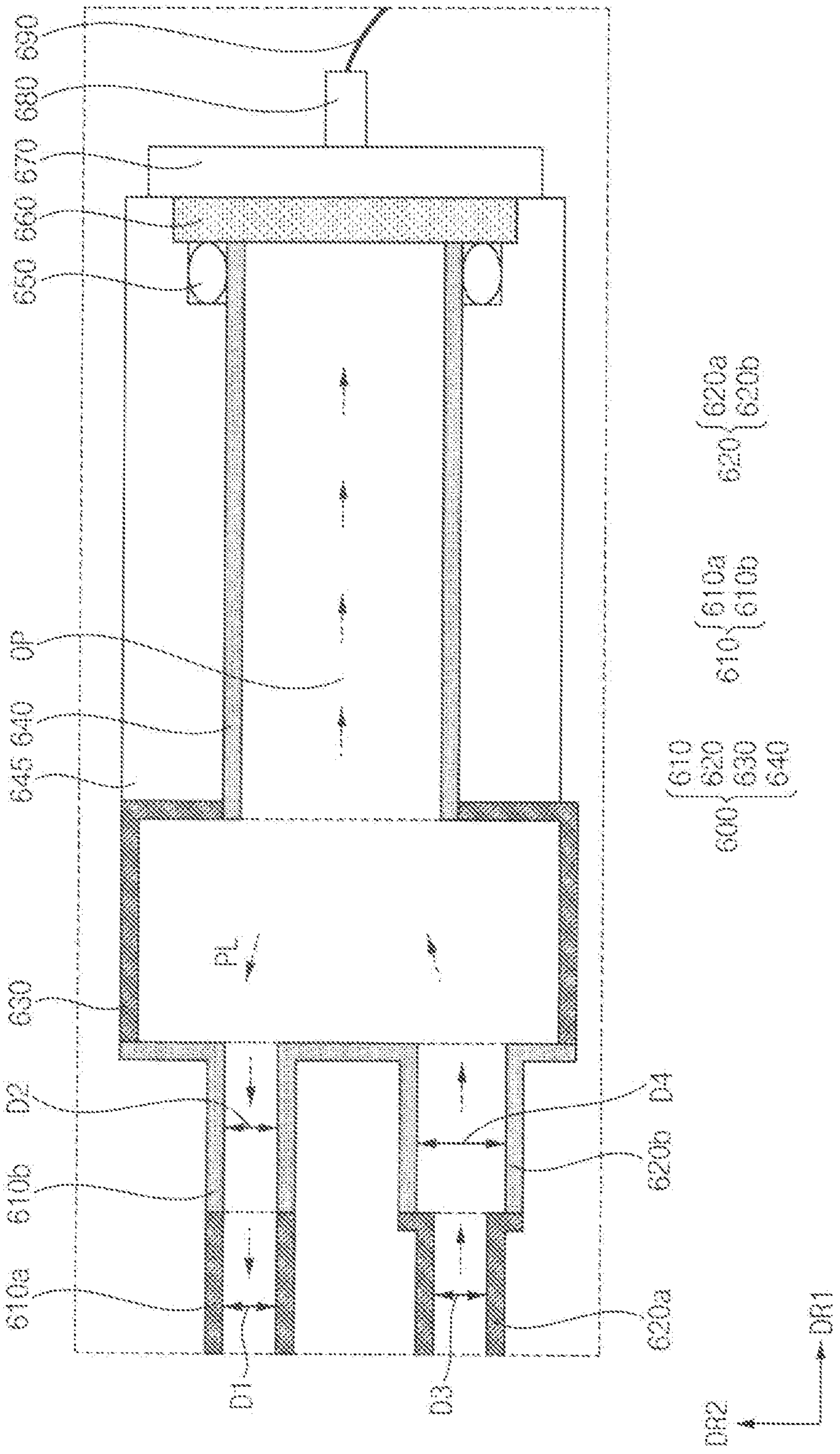
FIG. 7 is a schematic cross-sectional view illustrating a plasma monitoring apparatus according to an embodiment.

FIG. 7 is a schematic cross-sectional view illustrating a plasma monitoring apparatus according to an embodiment.

Referring to FIGS. 1 and 7, the plasma monitoring apparatus 1000 according to an embodiment may include a flow control portion 600, an insulator 645, a sealing member 650, a transparent glass window 660, a block member 670, a fiber optic connector 680, an optical fiber 690, a spectroscopic apparatus 700, and a control apparatus 800. The plasma monitoring apparatus 1000 described with reference to FIG. 7 may be substantially the same or similar to the plasma monitoring apparatus 1000 described with reference to FIG. 2 except for a shape of each of the first port 610 and the second port 620. Hereinafter, same descriptions will be omitted.

As described above, the first port 610 may include a first tube structure 610*a* and a second tube structure 610*b*. The second port 620 may include a third tube structure 620*a* and a fourth tube structure 620*b*.

The first inner diameter D1 of the first tube structure 610*a* may be same as the second inner diameter D2 of the second tube structure 610*b*. The third inner diameter D3 of the third tube structure 620*a* may be different from the fourth inner diameter D4 of the fourth tube structure 620*b*. For example, the third inner diameter D3 may be same as the first inner diameter D1 and the second inner diameter D2, respectively. However, the configuration of the disclosure is not limited thereto, and the third inner diameter D3 may be different from each of the first inner diameter D1 and the second inner diameter D2.

In an embodiment, the fourth inner diameter D4 may be greater than the third inner diameter D3 and the first inner diameter D1 may be same as the second inner diameter D2. The first port 610 may be an outlet port and the second port 620 may be an inlet port. For example, the emission light PL may be introduced into the plasma monitoring apparatus 1000 through the second port 620 and may be discharged through the first port 610.

The shape of each of the first, second, third, and fourth tube structures 610*a*, 610*b*, 620*a*, and 620*b* described with reference to FIGS. 4, 5, 6, and 7 are not limited thereto, and each of the first, second, third, and fourth tube structures 610*a*, 610*b*, 620*a*, and 620*b* may have various shapes.

The disclosure can be applied to a process of manufacturing various display devices. For example, the disclosure can be applied to a process for manufacturing high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A plasma monitoring apparatus connected to a process chamber and monitoring a plasma processing process in the process chamber in which a process using a plasma is performed, the plasma monitoring apparatus comprising:
  - a flow control portion including:
    - a first port connected to a first opening in a sidewall of the process chamber at a side of the plasma and through which an emission light emitted from the plasma is introduced or discharged; and
    - a second port connected to a second opening in the same sidewall of the process chamber at the side of the plasma and through which the emission light emitted from the plasma is introduced or discharged and which has a shape different from a shape of the first port;
  - a transparent glass window connected to the flow control portion and passing the emission light; and
  - a spectroscopic apparatus optically connected to the transparent glass window through an optical fiber and detecting a radiation intensity of the emission light,
  - wherein the second opening is offset from the first opening in a vertical plane of the sidewall of the process chamber.

2. The plasma monitoring apparatus of claim 1, wherein the first port includes:
  - a first tube structure having a first inner diameter; and
  - a second tube structure connected to the first tube structure and having a second inner diameter different from the first inner diameter, and
  - the second port includes:
    - a third tube structure having a third inner diameter; and
    - a fourth tube structure connected to the third tube structure and having a fourth inner diameter different from the third inner diameter.

3. The plasma monitoring apparatus of claim 2, wherein the second inner diameter is greater than the first inner diameter, and the fourth inner diameter is greater than the third inner diameter.

4. The plasma monitoring apparatus of claim 3, wherein the first port is an inlet port through which the emission light is introduced, and the second port is an outlet port through which the emission light is discharged.

5. The plasma monitoring apparatus of claim 3, wherein a length of the first tube structure in a traveling direction of the emission light is shorter than a length of the third tube structure in the traveling direction.

6. The plasma monitoring apparatus of claim 3, wherein the first inner diameter and the third inner diameter are equal to each other, and the second inner diameter and the fourth inner diameter are equal to each other.

7. The plasma monitoring apparatus of claim 2, wherein the second inner diameter is greater than the first inner diameter, and the third inner diameter is greater than the fourth inner diameter.

8. The plasma monitoring apparatus of claim 7, wherein the second port is an inlet port through which the emission light is introduced, and the first port is an outlet port through which the emission light is discharged.

9. The plasma monitoring apparatus of claim 2, wherein the first inner diameter is greater than the second inner diameter, and the fourth inner diameter is greater than the third inner diameter.

10. The plasma monitoring apparatus of claim 2, wherein the second inner diameter is greater than the first inner diameter, the fourth inner diameter is greater than the third inner diameter, and the third inner diameter is greater than the first inner diameter.

11. The plasma monitoring apparatus of claim 1, wherein the first port includes:

a first tube structure having a first inner diameter; and a second tube structure connected to the first tube structure and having the first inner diameter, and the second port includes:

a third tube structure having a third inner diameter; and a fourth tube structure connected to the third tube structure and having a fourth inner diameter different from the third inner diameter.

12. The plasma monitoring apparatus of claim 11, wherein the fourth inner diameter is greater than the third inner diameter.

13. The plasma monitoring apparatus of claim 1, wherein the flow control portion further includes: a common passage portion including a space through which the emission light travels between the first port and the transparent glass window and between the second port and the transparent glass window; and a common connection portion connecting the first port and the second port to the transparent glass window via the common passage portion.

14. The plasma monitoring apparatus of claim 1, wherein the spectroscopic apparatus includes an optical emission spectroscopy (OES).

15. A plasma processing apparatus comprising: a process chuck that supports a process object in a process chamber; a shower head facing the process chuck; and a plasma monitoring apparatus connected to the process chamber and monitoring a plasma processing process of a plasma in the process chamber, wherein the plasma monitoring apparatus includes: a flow control portion including: a first port connected to a sidewall of the process chamber at a side of the plasma and through which an emission light emitted from the plasma is introduced or discharged; and a second port connected to the sidewall of the process chamber at the side of the plasma and through which the emission light emitted from the plasma is introduced or discharged and which has a shape different from a shape of the first port; a transparent glass window extended to the flow control portion and passing the emission light; and a spectroscopic apparatus optically connected to the transparent glass window through an optical fiber and detecting a radiation intensity of the emission light, wherein the flow control portion further includes: a common passage portion including a space through which the emission light travels between the first port and the transparent glass window and between the second port and the transparent glass window; and a common connection portion connecting the first port and the second port to the transparent glass window via the common passage portion.

16. The plasma processing apparatus of claim 15, wherein the first port includes:

a first tube structure having a first inner diameter; and a second tube structure connected to the first tube structure and having a second inner diameter different from the first inner diameter, and the second port includes:

a third tube structure having a third inner diameter; and a fourth tube structure connected to the third tube structure and having a fourth inner diameter different from the third inner diameter.

17. The plasma processing apparatus of claim 16, wherein the second inner diameter is greater than the first inner diameter, and the fourth inner diameter is greater than the third inner diameter.

18. The plasma processing apparatus of claim 17, wherein the first port is an inlet port through which the emission light is introduced, and the second port is an outlet port through which the emission light is emitted.

19. The plasma processing apparatus of claim 17, wherein a length of the first tube structure in a traveling direction of the emission light is shorter than a length of the third tube structure in the traveling direction.

* * * * *